United States Patent
Kim et al.

(10) Patent No.: US 9,469,461 B2
(45) Date of Patent: Oct. 18, 2016

(54) CHILLER FOR CANISTER

(71) Applicant: DAYSTAR MATERIALS LLC, Gyeonggi-do (KR)

(72) Inventors: Jang Won Kim, Bundang-gu (KR); Woo Ho Son, Jangdan-dong (KR); Kwang Sik You, Bijeon-dong (KR); Moon Cheol Kang, Jochiwon-eup (KR)

(73) Assignee: Chemtura Corporation, Middlebury, CT (US)

( * ) Notice: Subject to any disclaimer, the term of this patent is extended or adjusted under 35 U.S.C. 154(b) by 0 days.

(21) Appl. No.: 14/771,529

(22) PCT Filed: May 10, 2013

(86) PCT No.: PCT/KR2013/004184
§ 371 (c)(1),
(2) Date: Aug. 31, 2015

(87) PCT Pub. No.: WO2014/171575
PCT Pub. Date: Oct. 23, 2014

(65) Prior Publication Data
US 2016/0016719 A1    Jan. 21, 2016

(30) Foreign Application Priority Data
Apr. 15, 2013 (KR) .................. 10-2013-0040802

(51) Int. Cl.
| B65D 81/38 | (2006.01) |
| B65D 1/34 | (2006.01) |
| B65D 25/38 | (2006.01) |

(Continued)

(52) U.S. Cl.
CPC .............. *B65D 81/38* (2013.01); *B65D 1/34* (2013.01); *B65D 25/38* (2013.01); *C23C 16/448* (2013.01); *F25D 1/00* (2013.01)

(58) Field of Classification Search
CPC   B65D 81/38; B65D 81/3813; B65D 81/261; B65D 21/0233; B65D 1/34; B65D 25/38; B65D 90/24; F16N 31/006; F16N 31/02; B67D 1/16; B67D 1/1256
USPC ........... 220/62.18, 661, 592.09, 592.02, 571, 220/23.89, 23.87, 23.83; 62/324.4; 141/106, 105, 364, 86, 311 A
See application file for complete search history.

(56) References Cited

U.S. PATENT DOCUMENTS

| 1,576,955 A | * | 3/1926 | Dubraks | ................ A23G 9/225 |
| | | | | 217/129 |
| 4,193,515 A | * | 3/1980 | Purdy | .................. B67D 1/0027 |
| | | | | 141/105 |

(Continued)

FOREIGN PATENT DOCUMENTS

| JP | 2003-194987 A | 7/2003 |
| KR | 10-2009-0131548 A | 12/2009 |

(Continued)

OTHER PUBLICATIONS

PCT International Search Report dated Dec. 30, 2013 from corresponding Application No. PCT/KR2013/004184, along with unofficial English translation.

*Primary Examiner* — Robert J Hicks
(74) *Attorney, Agent, or Firm* — Dilworth IP, LLC

(57) ABSTRACT

Disclosed is a chiller for a canister including: a drum-shaped tray with an open upper part; an inner casing inserted in the tray with a given space between the inside wall surface of the tray and the inner casing for receiving the canister; and a drainage container arranged between the inner casing and the tray for collecting cooling water discharged from the inner casing, thus preventing dew from being produced on the surface of the tray.

16 Claims, 5 Drawing Sheets

(51) Int. Cl.
  *F25D 1/00*       (2006.01)
  *C23C 16/448*     (2006.01)

(56) References Cited

U.S. PATENT DOCUMENTS 4,436,621 A * 3/1984 Picker .................... B01D 23/00
                                               210/232
4,986,436 A * 1/1991 Bambacigno ............ B67D 7/32
                                               141/86
5,327,948 A * 7/1994 Blakemore .............. B67D 7/68
                                               137/312
5,467,890 A * 11/1995 Hussey .............. B01D 17/0208
                                               210/540

FOREIGN PATENT DOCUMENTS

| KR | 10-2010-0097823 A | 9/2010 |
| KR | 10-2012-0009224 A | 2/2012 |
| KR | 10-2012-0020025 A | 3/2012 |

* cited by examiner

CHILLER FOR CANISTER

TECHNICAL FIELD

The present invention relates to a canister.

BACKGROUND OF THE INVENTION

The canister is a container for storing the organic and inorganic metallic compounds used in a manufacturing process relating to semiconductors and electronic materials. Most of the organic and inorganic metallic compounds are specially designed expensive compounds of high purity, and most of such precursors are very sensitive to air or water, and so the canister is made of a metal providing sealing and resistance to chemicals.

The canister must be kept at a given temperature in order to preserve the organic and inorganic metallic compounds stored therein. To this end, a chiller is used for cooling the canister.

The chiller encloses the canister, circulating cooling water for cooling the canister. A chiller is disclosed in Registered Patent No. 10-0773474 entitled as "CHILLER SYSTEM FOR SEMICONDUCTOR MANUFACTURING EQUIPMENT".

FIG. 1 is a cross-sectional view of a conventional chiller 10. As shown in the drawing, the chiller 10 includes a tray 11, and an inner casing 13 inserted in the tray 11 for receiving a canister 20. As indicated by an arrow, the cooling water a, supplied through an inlet tube 15 flows through aperture 13a between the inner casing 13 and the canister 20, discharged through a discharge tube 17.

The inset shown in FIG. 1 is an enlarged view of the upper sealing structure of the conventional chiller sealing block 18, sealing cover 18a, sealing member 19, and engaging member 179.

In this case, the chiller 10 is designed that the cooling water discharged from the inner casing 13 is collected in the space (S1) between the tray 11 and the inner casing 13, and then discharged through the discharge tube 17. Here, the temperature of the cooling water is different from the atmospheric temperature of the outside, and therefore vapor is condensed on the outside wall of the tray 11 to produce dew (M) causing a problem.

CONTENT OF THE INVENTION

Objects of the Invention

According to an embodiment of the present invention, a chiller for the canister is provided for preventing dew from being produced on the outside wall of the tray.

According to another embodiment of the present invention, a chiller for the canister is provided for preventing the cooling water from leaking outside by improving the connection structure of the cover and the sealing member.

According to yet another embodiment of the present invention, a chiller for the canister is provided for preventing the canister from being displaced.

According to a further embodiment of the present invention, a chiller for the canister is provided for collecting the dew produced on the upper surfaces of the cover so as to prevent the dew from flowing down to the bottom.

The objects and advantages of the present invention will be clearly understood by those skilled in the art from preferred embodiments of the present invention.

SUMMARY OF THE INVENTION

According to an embodiment of the present invention, a chiller for a canister includes: a drum-shaped tray with an open upper part; an inner casing inserted in the tray with a given space between the inside wall surface of the tray and the inner casing for receiving the canister; and a drainage container arranged between the inner casing and the tray for collecting cooling water discharged from the inner casing.

According to another embodiment of the present invention, the drainage container is separated from the inside wall of the tray with a given space.

According to another embodiment of the present invention, an insulation layer is arranged in the given space between the drainage container and the inside wall of the tray.

According to another embodiment of the present invention, a cooling water discharge tube is connected through the tray to the drainage container so as to discharge all the cooling water collected into the drainage container from the inner casing through the cooling water discharge tube.

According to another embodiment of the present invention, the drainage container is shaped like a ring enclosing the inner casing.

According to another embodiment of the present invention, a plurality of inverted triangle-shaped overflow apertures are formed with a given interval between the apertures in the inside of the upper part of the inner casing so as to communicate with the drainage container, so that the cooling water flowing in the inner casing moves through the overflow apertures to the drainage container.

According to another embodiment of the present invention, a plurality of inverted triangle-shaped overflow apertures are formed with a given interval between the apertures in the inside of the upper part of the inner casing so as to communicate with the drainage container, so that the cooling water flowing in the inner casing moves through the overflow apertures to the drainage container.

According to another embodiment of the present invention, a locking skirt is formed in the bottom of the inner casing so as to lock with a locking bar extended along the circumference of the lower part of the canister to a given length.

According to another embodiment of the present invention, a chiller for a canister includes: an upper sealing part fixedly connected to the upper part of the tray and the inner casing; a detachable sealing member detachably attached to the upper surface of the upper sealing part; and a sealing cover connected to the upper part of the detachable sealing member for pressing the detachable sealing member so as to prevent the cooling water from flowing outside.

According to another embodiment of the present invention, the upper surface of the upper sealing part is provided with a seat surface depressed with a given depth for seating the detachable sealing member, and the upper part of the sealing cover is provided with a pressure slope projection having a length increasing along the radial direction from the inside to the outside for pressing the detachable sealing member.

According to another embodiment of the present invention, a dew reception groove is formed by depressing the upper surface of the sealing cover like a trench along the perimeter to receive dew, and a dehumidifying pocket is connected to the outside surface of the upper part of the tray to collect the dew from the dew reception groove.

According to another embodiment of the present invention, a chiller for a canister further includes a pocket connection tube with one end arranged in the dew reception groove and the other end detachably attached to the dehumidifying pocket.

Effects of the Invention

According to at least one embodiment of the present invention, dew is prevented from forming on the outside of the chiller for the canister.

According to at least one embodiment of the present invention, the dew condensed on the upper surface of the sealing cover is received by the dew reception groove, and discharged to the dehumidifying pocket, thus preventing the dew from flowing down to the bottom.

According to at least one embodiment of the present invention, the slanted surface of the pressure slope projection presses the detachable sealing member so as to effectively prevent the cooling water from leaking outside.

According to at least one embodiment of the present invention, the lower part of the inner casing is provided with a locking skirt for preventing the canister from turning, thus stably fixing the position of the canister.

DETAILED DESCRIPTION FOR CARRYING OUT THE PRESENT INVENTION

Figure 1:
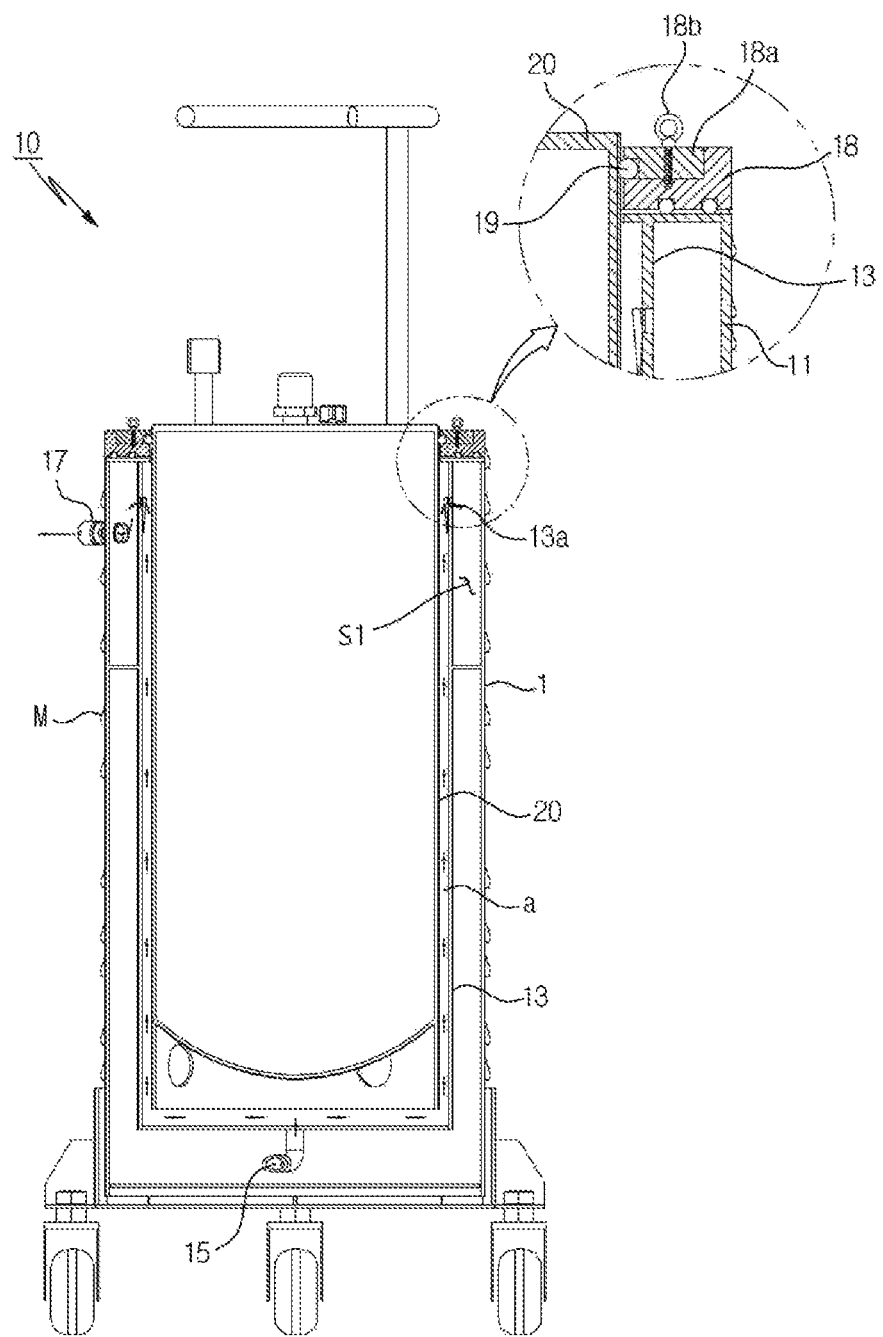
FIG. 1 is a cross-sectional view of a conventional chiller for the canister.

In order to clearly understand the present invention, preferred embodiments of the present invention are described with reference to the attached drawings. An embodiment of the present invention may be modified variously, and the scope of the present invention must not be limited to the embodiments specifically described below. The embodiments are provided for a person skilled in the art to clearly understand the present invention. Therefore, the shapes, etc. of the constituent parts may be exaggerated for emphasizing a clear description. It is noted that the same elements are represented by the same reference numerals. The conventional functions and structures that may confuse the gist of the present invention are not described.

Figure 2:
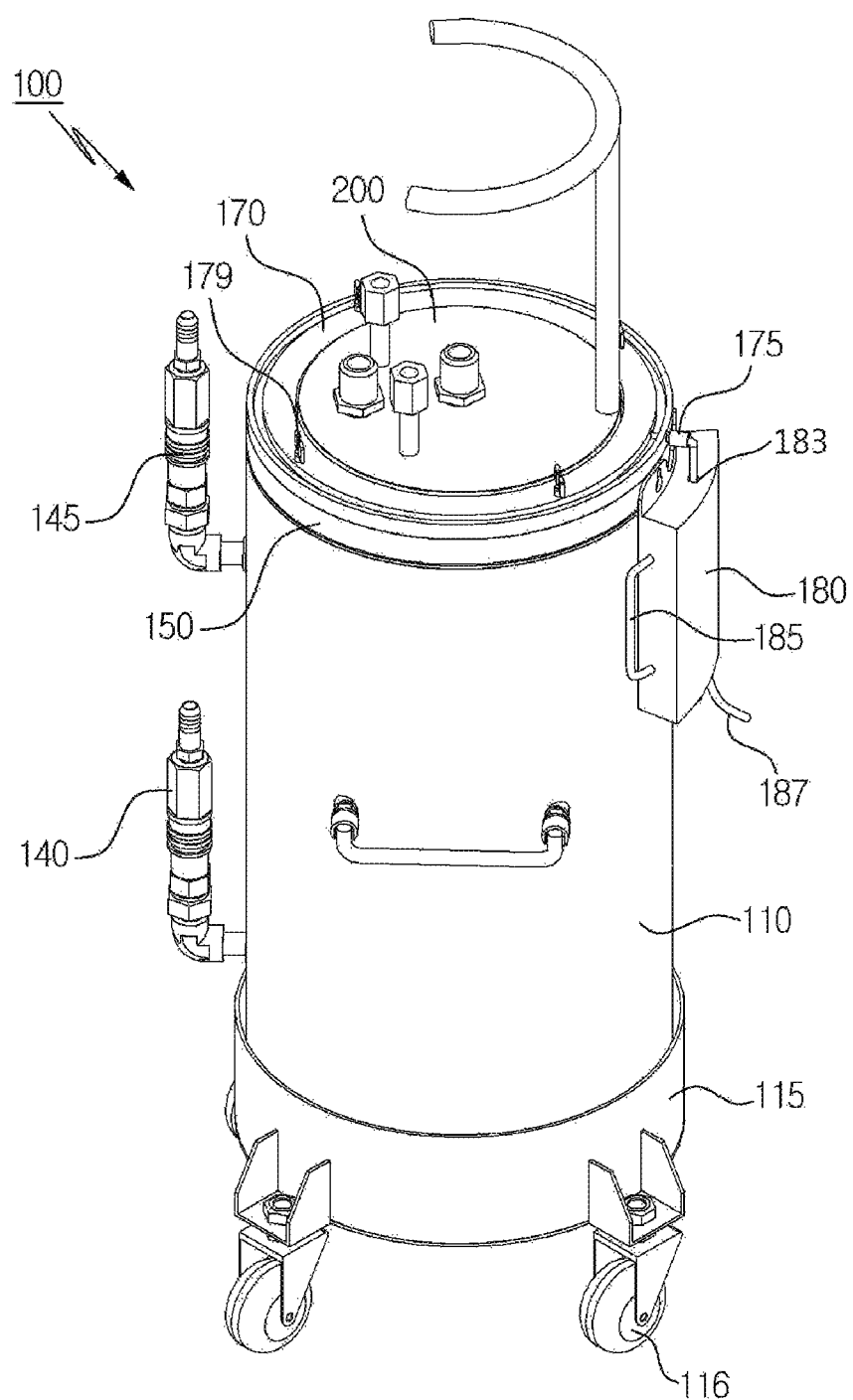
FIG. 2 is a perspective view for illustrating the outer structure of a chiller for the canister according to the present invention.
Figure 3:
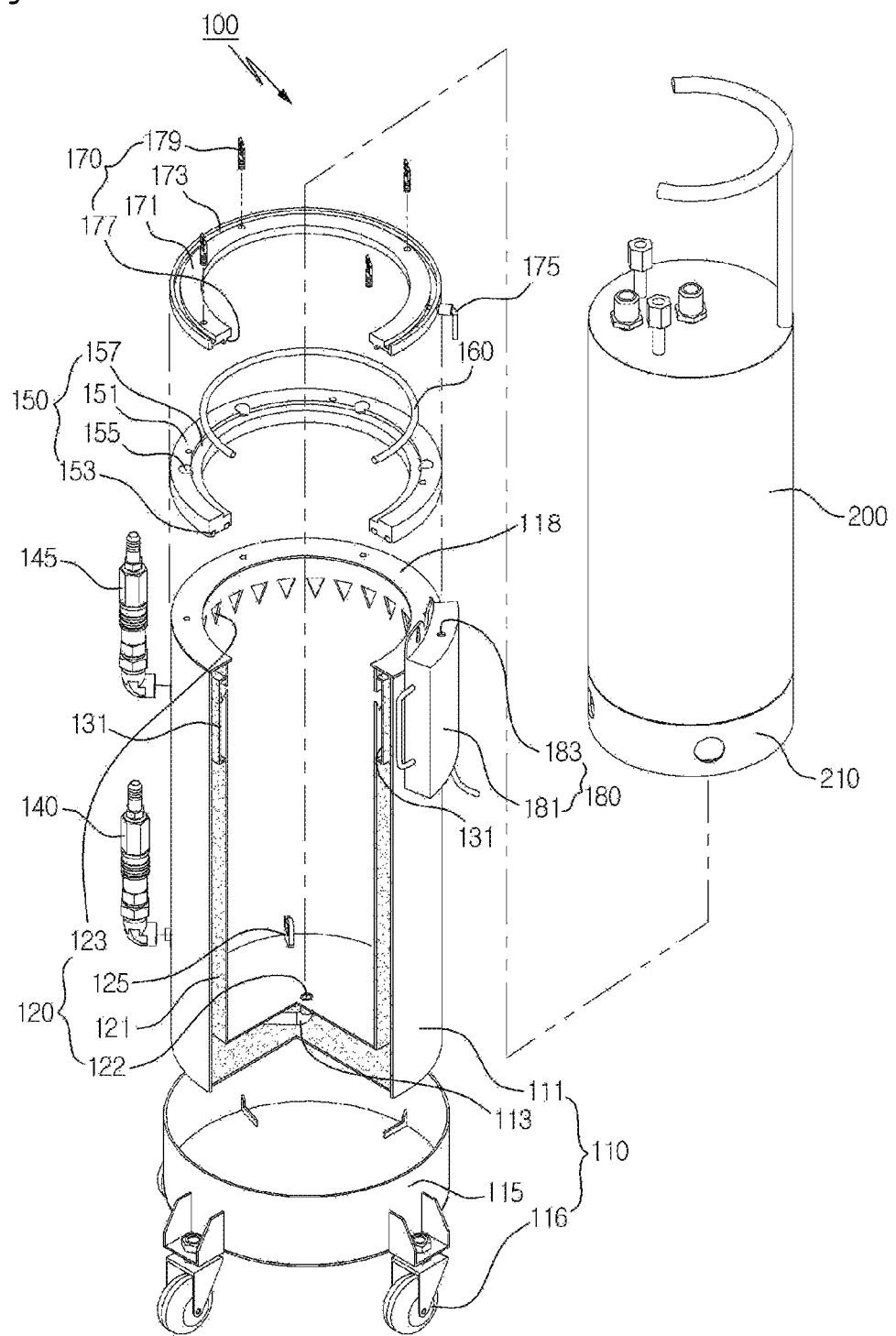
FIG. 3 is a perspective view for illustrating the disassembled structure of a chiller for the canister according to the present invention.
Figure 4:
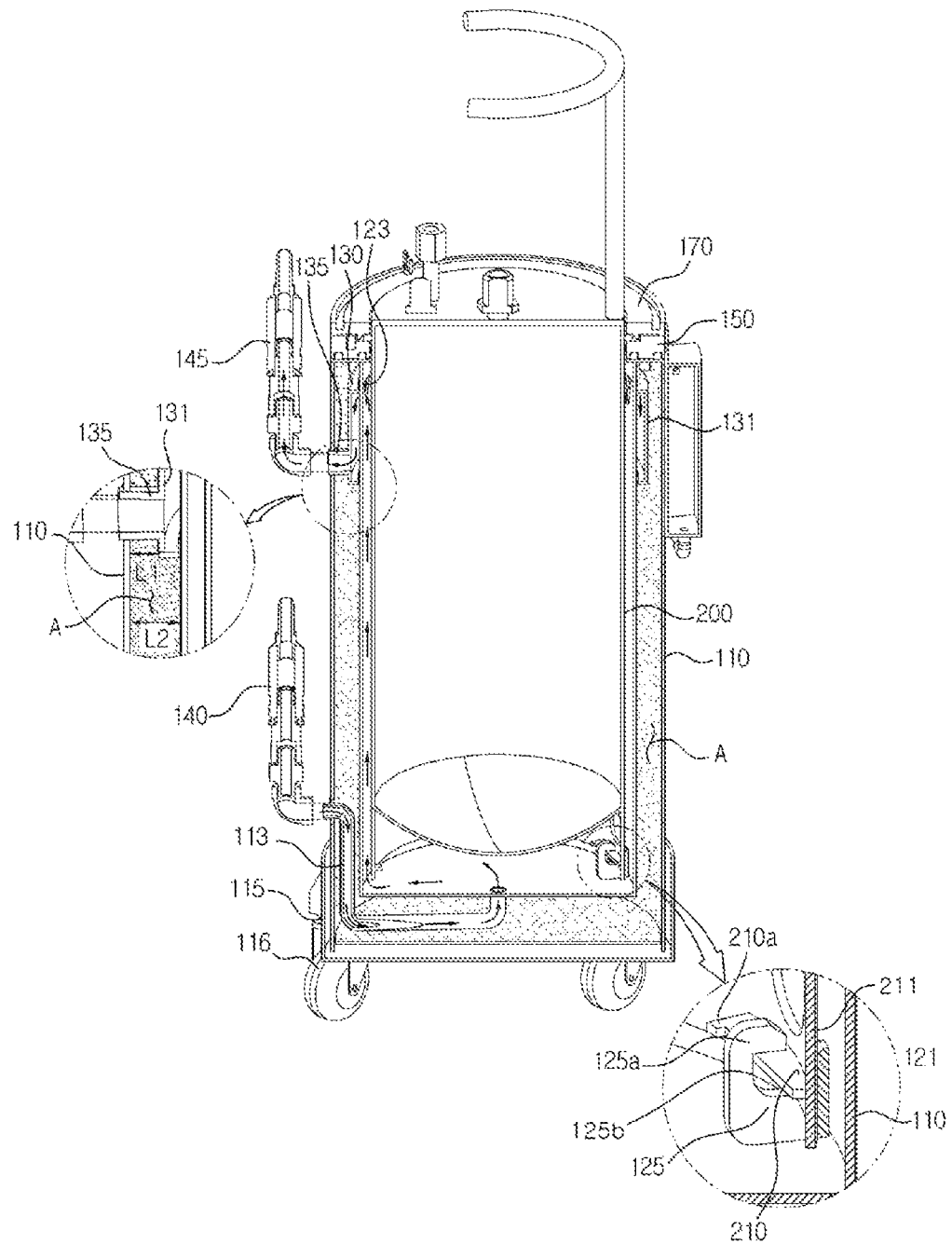
FIG. 4 is a cross-sectional view of a chiller for the canister according to the present invention, and the flow path of the cooling water.
Figure 5:
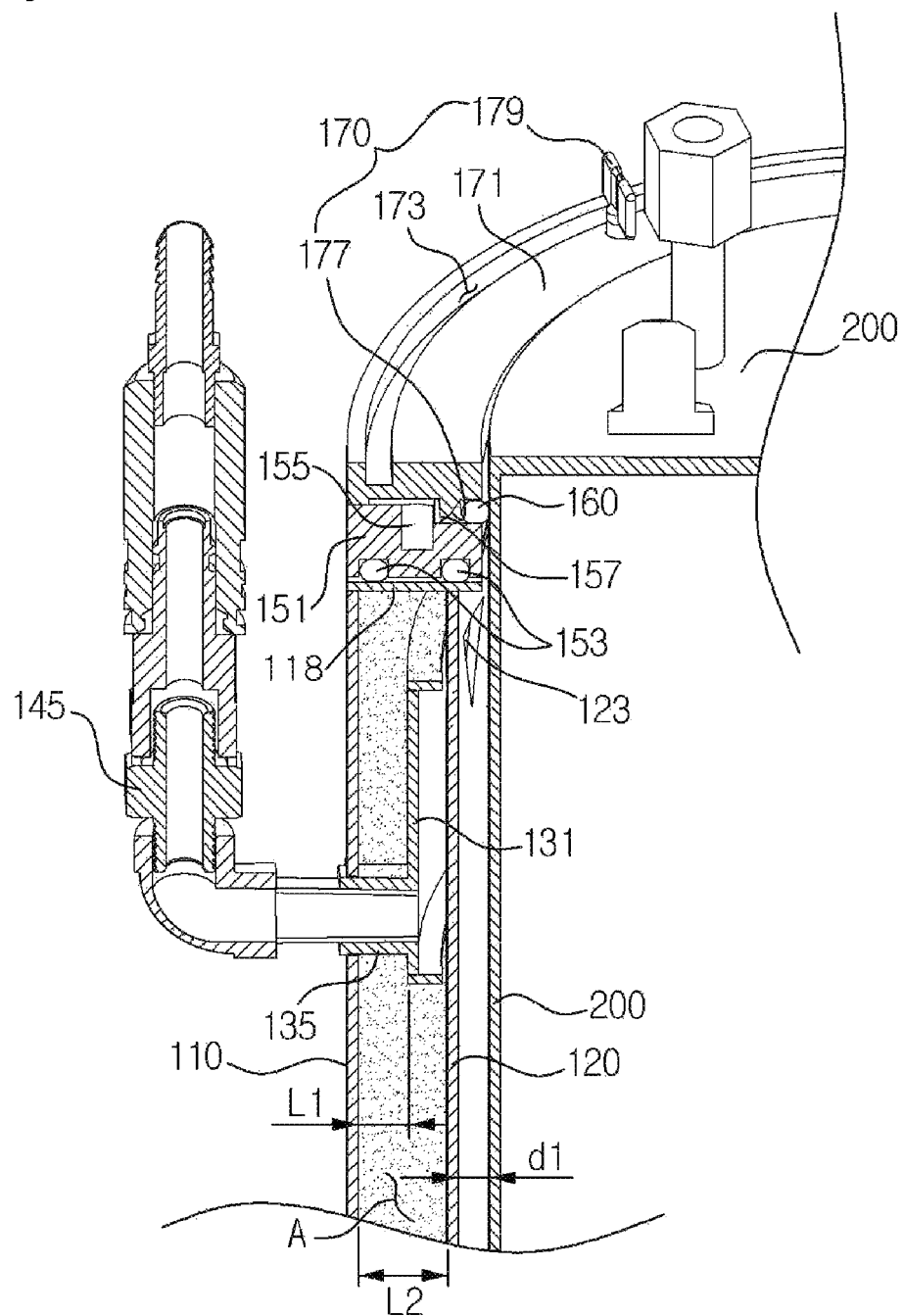
FIG. 5 is an enlarged view of the upper sealing structure of a chiller for a canister according to the present invention.

FIG. 2 is a perspective view of the external structure of a chiller 100 for a canister according to an embodiment of the present invention, FIG. 3 a perspective view of the disassembled structure of a chiller 100 for a canister according to an embodiment of the present invention, FIG. 4 a cross-sectional view of a chiller 100 for the canister according to the present invention, and the flow path of the cooling water, and FIG. 5 an enlarged view of the upper sealing structure of a chiller 100 for a canister according to the present invention.

As shown in the drawings, a chiller 100 for a canister according to the present invention encloses a canister 200, and circulates cooling water for cooling the canister 200 to a given temperature. In this case, the chiller 100 for a canister is provided with a circulation pump (not shown) for circulating the cooling water.

The chiller 100 according to an embodiment of the present invention includes a drum-shaped tray 110, an inner casing 120 inserted in the tray 110 for enclosing the canister 200, a drainage container 130 arranged between the tray 110 and the inner casing 120, an inlet tube 140 for guiding the cooling water into inner casing 120, a discharge tube 145 for discharging the cooling water of the drainage container 130 outside, an upper sealing part 150 connected to the upper part of the tray 110 and the inner casing 120, a detachable sealing member 160 detachably attached to the upper sealing part 150, a sealing cover 170 connected to the upper part of the detachable sealing member 160, and a dehumidifying pocket 180 connected to the outer pheripheral surface of the tray 110 for collecting the dew produced in the sealing cover 170.

The tray 110 is formed as a cylinder with a given diameter for enclosing the inner casing 120 and the canister 200. The tray 110 includes a tray body 111, an inner inlet tube 113 for connecting the tray body 111 and the inner casing 120, and a moveable container 115 connected to the bottom of the tray 110.

The tray body 111 makes the cooling water stably flow in and out, and stably supports the canister 200. The lower part of the tray body 111 is provided with an inlet tube 140, and the upper part thereof with a discharge tube 145. The inlet tube 140 is connected to the inner inlet tube 113. The inner inlet tube 113 is connected to an inlet hole 122 in the bottom of the inner casing 120 so as to supply the cooling water to the inner casing 120.

The moveable container 115, for example, is connected to the bottom of the tray 110 for supporting the tray 110 to be moved. The lower part of the moveable container 115 is provided with a plurality of wheels 116.

The upper part of the tray body 111 is provided with a connection plate 118 for connecting the inner casing 120 and the tray body 111. The upper surface of the connection plate 118 is provided with an upper sealing part 150.

The inner casing 120 is inserted in the tray 110 separated by a given space from the inside of the tray. The inner casing 120 encloses the canister 200. The inner casing 120, for example, includes an inner casing body 121 inserted in the tray body 111, an overflow aperture 123 penetrating the inside wall of the inner casing body 121 for discharging the cooling water to the drainage container 130, and a plurality of locking skirts 125 formed in the bottom of the inner casing 121.

The inner casing body 121 receives the canister 200 so as to make the canister 200 exchange heat with the cooling water flowing between the inner casing body 121 and the canister 200. The inner casing body 121 has an outer diameter separated by a given space from the tray body 111.

The separation space between the inner casing body 121 and the tray body 111 is filled with an insulation material (A). The insulation material (A) prevents the heat exchange between the cooling water and the outside wall of the tray 110, thus preventing the outside of the tray 110 from producing dew.

The separation space (L2) between the inner casing body 121 and the tray body 111 may be adjusted according to the temperature of the cooling water. Also, the kind of insulation material (A) may be chosen according to the temperature of the cooling water. Besides, according to another embodiment, the air may serve as an insulation layer instead of a separate insulation material (A).

The inner diameter of the inner casing body 121 is greater than the outer diameter of the canister 200 by a given length (dl). The inner diameter of the inner casing body 121 according to an embodiment of the present invention is greater than the outer diameter of the canister 200 by 1 mm. The cooling water flows between the outside of the canister 200 and the inside of the inner casing body 121 so as to exchange heat with the canister 200.

The overflow aperture 123 is formed penetrating the inside wall surface of the upper part of the inner casing body 121. The overflow aperture 123 discharges the cooling water having exchanged heat with the canister 200 to the drainage container 130. The cooling water is prevented from flowing upward by means of an upper sealing block 151, thus overflowing to the overflow aperture 123.

In the present embodiment, the overflow aperture 123 may be shaped like an inverted triangle. Thus, the cross section of the overflow aperture 123 decreases from the upper part to the lower part so as to reduce eddies of the cooling water discharged through the overflow aperture 123 to the drainage container 130.

The locking skirt 125 fixes the position of the canister 200 inserted in the inner casing body 121. The locking skirt 125, as shown in FIG. 4, is formed protruding from the lower side wall of the inner casing body 121. The locking skirt 125 has an end region 125a protruding radially inwardly from the side wall and vertically bent. Thus, a connection groove 125b is formed between the end region 125a and the side wall to receive a locking bar 210 of canister 200.

The locking bar 210 is formed protruding along the inner perimeter of the lower side wall 211 of the canister 200. The end of the locking bar 210 is formed with a stepped locking projection 210a. The length of the locking projection 210a may be greater than the width of the connection groove 125b. thus, inserting the canister 200 into the inner casing 120, the side wall 211 of the canister 200 is inserted in the connection groove 125b of the locking skirt 125. Then turning the canister 200, the locking bar 210 is inserted in the connection groove 125b so as to cause the locking projection 210a to contact the end region 125a, thus preventing the turning of the canister.

Thus, the position of the canister 200 and the inner casing 120 is fixed, so that the cooling water flowing in the inner casing 120 stably exchanges heat with the canister 200.

The drainage container 130 interposed between the tray 110 and the inner casing 120 collects the cooling water discharged to the discharge tube 145. The drainage container 130 is shaped like a ring enclosing the outer wall surface of the inner casing 120 corresponding to the overflow aperture 123. In this case, the width of the drainage container 130 is formed so as to be separated from the inside wall surface of the tray 110 by a given space, L1. Thus, the insulation material (A) can be inserted between the drainage container outer wall 131 and the inside wall surface of the tray 110.

The drainage container 130 is separately provided between the tray 110 and the inner casing 120 so as to make the cooling water be discharged through the drainage container 130 to the discharge tube 145, thus preventing the cooling water from directly contacting the tray 110 compared with the conventional chiller 10 as shown in FIG. 1. Besides, the insulation material (A) is arranged between the drainage container 130 and the tray 110 so as to prevent the outside wall surface of the tray 110 from producing the dew.

The inlet tube 140 is connected to the outside of the tray 110 to guide the cooling water to the inside of the tray 110. The inlet tube 140 is connected to the inner inlet tube 113 to supply the cooling water.

The discharge tube 145 is connected to the drainage container 130 to discharge the cooling water having finished the heat exchange outside. The discharge tube 145 is connected via a connection tube 135 of the drainage container 130.

FIG. 5 is an enlarged cross-sectional view for illustrating the upper sealing structure of the canister chiller 100. As shown in the drawing, the upper sealing part 150 is arranged in the upper part of the tray 110 and the inner casing 120 so as to prevent the cooling water from leaking outside. The upper sealing part 150 includes an upper sealing block 151 integratedly connected to the upper part of the connection plate 118, and a plurality of lower sealing members 153 arranged between the upper sealing block 151 and the connection plate 118.

The upper sealing block 151 is fixedly connected to the connection plate 118. The lower sealing member 153 is fixedly connected between the connection plate 118 and the upper sealing block 151 to prevent the cooling water from leaking laterally (namely, radially outwardly from the center of the canister chiller 100). The lower sealing member 153 may be made as an O-ring.

The outer peripheral surface of the inside of the upper sealing block 151 is provided with a seat surface 157 depressed so as to form a step with a given depth. The detachable sealing member 160 is seated in the seat surface 157.

The outer peripheral surface of the outside of the upper sealing block 151 is provided with an engaging member insertion groove 155 by a given interval so as to prevent interference with the seat surface 157. An engaging member 179 is inserted in the engaging member insertion groove 155 to fix the position of the upper sealing block 151 and the sealing cover 170.

The detachable sealing member 160 is detachably attached to the upper sealing member 150. The detachable sealing member 160 is seated on the seat surface 157, and closely contacts the seat surface 157 pressed by the sealing cover 170 so as to prevent the cooling water from leaking outside. The detachable sealing member 160 also may be made as an O-ring.

The sealing cover 170 is connected to the upper part of the upper sealing part 150. The sealing cover 170 presses the upper sealing part 150 downwardly so as to cause the detachable sealing member 160 to closely contact the upper sealing part 150. The sealing cover 170 includes a sealing cover body 171, a dew reception groove 173 formed by depression in the perimeter of the sealing cover body 171, a pocket connection tube 175 for connecting the dew reception groove 173 and a dehumidifying pocket 180, and a pressure slope projection 177 protruding from the lower part of the sealing cover 170 for pressing the detachable sealing member 160.

The sealing cover body 171 is shaped like a ring to cover the upper part of the upper sealing part 150. The dew reception groove 173 is formed by depressing the upper surface of the sealing cover body 171 like a trench along the perimeter thereof.

The insulation material (A) is inserted between the tray 110 and the inner casing 120, but there is no insulation material (A) inserted between the upper sealing part 150 and the sealing cover 170, so that dew may be produced on the upper surface of the sealing cover body 171 due to the temperature difference between cooling water and the outside. The dew reception groove 173 is formed depressed in the sealing cover body 171 by a given depth so as to receive the dew produced by condensation. The dew reception groove 173 prevents the dew from flowing downward along the sealing cover 170.

The pocket connection tube 175 has one end arranged in the dew reception groove 173 and the other end detachably connected to the humidifying pocket 180. The dew received in the dew reception groove 173 flows through the pocket connection tube 175 to the humidifying pocket 180.

The pressure slope projection 177 is formed protruding from the lower part of the sealing cover body 171. In this case, the pressure slope projection 177 is arranged separated from the inside boundary of the sealing cover body 171 by the diameter of the detachable sealing member 160. In addition, the pressure slope projection 177 is slantingly formed so as to have a length increasing radially outwardly.

Because of such shape of the pressure slope projection 177, if the sealing cover 170 is pressed by the engaging member 179 toward the upper sealing member 150, the detachable sealing member 160 makes a close contact between the slanting surface of the pressure slope projection 177 and the connection plate 118, thus improving the sealing effect. Also, the pressure slope projection 177 contacts the seat surface 157 to effectively prevent the cooling water from leaking.

The humidifying pocket 180 is connected to the upper outside wall of the tray 110 to collect the dew produced from the sealing cover 170.

The humidifying pocket 180, for example, includes a pocket body 181 with a chamber for receiving dew, a level guage 185 arranged to one side of the pocket body 181 for indicating the dew level, and a dew discharge tube 187 for discharging the dew of the pocket body 181 outside.

The pocket body 181, for example, is connected to the outside wall of the tray 110. The upper part of the pocket body 181 is provided with a dew inlet hole 183 connected to the pocket connection tube 175, thus guiding the dew to the inside of the pocket body 181.

The level gauge 185 is checked visually to discharge the dew by switching the dew discharge tube 187.

The operation of the chiller 100 for the canister according to the present invention is described with reference to FIGS. 2 to 5.

Firstly, the canister 200 is inserted in the inner casing 120. In this case, the detachable sealing member 160 and the sealing cover 170 are separated from the tray 110. After inserting the canister 200 in the inner casing 120, as shown in FIG. 4, the side wall 211 of the canister 200 is disposed so as to be inserted in the connection groove 125b of the locking skirt 125, and turned clockwise or anticlockwise.

By turning, the locking bar 210 is inserted in the connection groove 125b, and the locking projection 210a contacts the end region 125a, thus preventing the canister 200 from moving. Thus, the position of the canister 200 is stably fixed during the cooling water flowing to perform heat exchange.

Meanwhile, the canister 200 is inserted in the inner casing 120 with the detachable sealing member 160 connected to the peripheral surface. The insertion of the canister 200 causes the detachable sealing member 160 to be seated on the seat surface 157 of the upper sealing block 151.

When the position of the canister 200 is fixed, the sealing cover 170 is disposed in the upper part of the detachable sealing member 160. Then a plurality of engaging members 179 are fastened so as to fix the sealing cover 170 to the upper sealing block 151. In this case, the pressure slope projection 177 presses the detachable sealing member 160 so as to enhance the sealing force between the upper sealing block 151 and the sealing cover 170, doubly preventing the cooling water from leaking outside.

Completing the connection of the sealing cover 170, the pocket connection tube 175 is connected to the dehumidifying pocket 180. Thus, completing the connection of the canister 200 and the chiller 100, the cooling water is supplied to the inside of the inner casing 120.

The cooling water flows through the inlet tube 140 and the inner inlet tube 113 into the inner casing 120, as shown by an arrow in FIG. 4. The cooling water flows through the separation space between the inside wall of the inner casing 120 and the canister 200 to the overflow groove 123 to the drainage container 130. The cooling water collected in the drainage container 130 is discharged through the connection tube 135 and the discharge tube 145 outside.

In this case, the insulation material (A) is inserted in the separation space between the inner casing 120 and the tray 110 so as to prevent the cooling water from contacting the outside air. Thus, the outside wall of the tray 110 is kept at a temperature equal or almost equal to the outside temperature, not producing dew.

Also, the drainage container 130 is arranged separated from the inside wall of the tray 110, and the insulation material (A) is inserted between them, thus not producing dew throughout the tray 110.

The surface of the sealing cover 170 produces dew due to the temperature difference between the cooling water and the air. The dew produced by condensation is collected in the stepped dew reception groove 173. The dew collected in the dew reception groove 173 to a given level is moved through the pocket connection tube 175 to the humidifying pocket 180. The dew received in the humidifying pocket 180 is discharged through the dew discharge tube 145 outside.

The embodiment of the canister chiller described above is only an example, and it will be appreciated by a person skilled in the art that such an embodiment may be variously modified or changed without departing from the invention. Therefore, the present invention is not limited by the form described above. Hence, the protected scope of the present invention should be determined by the technical concept of the attached claims. Also, it is noted that the invention includes all modifications, changes, and substitutes within the scope of the gist of the invention.

DESCRIPTION OF REFERENCE NUMERALS

100: chiller for canister
110: tray
111: tray body
113: inner inlet tube
115: moveable container
116: wheel
118: connection plate
120: inner casing
121: inner casing body
122: inlet hole
123: overflow groove
125: locking skirt
125a: end region
125b: connection groove
130: drainage container
131: drainage container outer wall
135: connection tube
140: inlet tube
145: discharge tube 150: upper sealing part
151: upper sealing block
153: lower sealing member
155: engaging member insersion groove
157: seat surface
160: detachable sealing member
170: sealing cover
171: sealing cover body
173: dew reception groove
175: pocket connection tube
177: pressure slope projection
179: engaging member
180: dehumidifying pocket
181: pocket body
183: dew inlet hole
185: level gauge
187: dew discharge tube
200: canister
210: locking bar
210a: locking projection
A: insulation material

The invention claimed is:

1. A chiller for a canister comprising:
   a drum-shaped tray with an open upper part, an outside surface and an inside wall surface;
   an inner casing for receiving said canister inserted in said tray with a separation space between the inside wall surface of said tray and said inner casing having an upper part with an inside wall surface and a bottom; and
   a drainage container arranged between said inner casing and said tray for collecting cooling water discharged from said inner casing, wherein said drainage container is separated from the inside wall surface of said tray by a given space.

2. The chiller for a canister according to claim 1, characterized in that an insulation layer is arranged in said given space between said drainage container and the inside wall surface of said tray.

3. The chiller for a canister according to 2, characterized in that a cooling water discharge tube is connected through said tray to said drainage container so as to discharge all the cooling water collected into said drainage container from said inner casing through said cooling water discharge tube.

4. The chiller for a canister according to claim 3, characterized in that said drainage container is in the shape of a ring enclosing said inner casing.

5. The chiller for a canister according to claim 1, characterized in that a plurality of inverted triangle-shaped overflow apertures are formed with a given interval between said apertures in the inside wall surface of the upper part of said inner casing so as to communicate with said drainage container, so that the cooling water flowing in said inner casing moves through said overflow apertures to said drainage container.

6. The chiller for a canister according to claim 3, characterized in that a plurality of inverted triangle-shaped overflow apertures are formed with a given interval between said apertures in the inside wall surface of the upper part of said inner casing so as to communicate with said drainage container, so that the cooling water flowing in said inner casing moves through said overflow apertures to said drainage container.

7. The chiller for a canister according to claim 3, characterized in that a locking skirt is formed in the bottom of said inner casing so as to lock with a locking bar extended along a lower part of said canister to a given length.

8. The chiller for a canister according to claim 3, further comprising:
   an upper sealing part having an upper surface fixedly connected to the upper part of said tray and said inner casing;
   a detachable sealing member having an upper part detachably attached to the upper surface of said upper sealing part; and
   a sealing cover having an upper surface and a perimeter connected to the upper part of said detachable sealing member for pressing said detachable sealing member so as to prevent the cooling water from flowing outside.

9. The chiller for a canister according to claim 8, characterized in that the upper surface of said upper sealing part is provided with a seat surface depressed so as to form a step with a given depth for seating said detachable sealing member, and said sealing cover is provided with a pressure slope projection having a length increasing radially outwardly for pressing said detachable sealing member.

10. The chiller for a canister according to claim 9, characterized in that a dew reception groove is formed by depressing the upper surface of said sealing cover by a given depth along the perimeter to form a trench to receive dew, and a dehumidifying pocket is connected to the outside surface of the upper part of said tray to collect the dew from said dew reception groove.

11. The chiller for a canister according to claim 10, further comprising a pocket connection tube with one end arranged in said dew reception groove and another end detachably attached to said dehumidifying pocket.

12. The chiller for a canister according to claim 1, further comprising:
   an upper sealing part having an upper surface fixedly connected to the upper part of said tray and said inner casing;
   a detachable sealing member having an upper part detachably attached to the upper surface of said upper sealing part; and
   a sealing cover having an upper surface and a perimeter connected to the upper part of said detachable sealing member wherein said sealing cover is provided with a pressure slope projection having a length increasing radially outwardly for pressing said detachable sealing member; and
   a dehumidifying pocket for collecting dew produced in said sealing cover.

13. The chiller for a canister according to claim 12, characterized in that said dehumidifying pocket is connected to the outside surface of the upper part of said tray.

14. The chiller for a canister according to claim 12, characterized in that a dew reception groove is formed by depressing the upper surface of said sealing cover along the perimeter to form a trench to receive dew, and a pocket connection tube connects said dew reception groove and said dehumidifying pocket.

15. The chiller for a canister according to claim 12, characterized in that a cooling water discharge tube is connected through said tray to said drainage container so as to discharge all the cooling water collected into said drainage container from said inner casing through said cooling water discharge tube.

16. The chiller for a canister according to claim 12, characterized in that a plurality of inverted triangle-shaped overflow apertures are formed with a given interval between said apertures in the inside wall surface of the upper part of said inner casing so as to communicate with said drainage container, so that the cooling water flowing in said inner casing moves through said overflow apertures to said drainage container.

\* \* \* \* \*